(12) United States Patent
Singh et al.

(10) Patent No.: US 7,714,635 B2
(45) Date of Patent: May 11, 2010

(54) DIGITAL ADAPTIVE VOLTAGE SUPPLY

(75) Inventors: Deepak K. Singh, Apex, NC (US); Francois Ibrahim Atallah, Raleigh, NC (US); David John Seman, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 11/671,531

(22) Filed: Feb. 6, 2007

(65) Prior Publication Data

US 2008/0186082 A1 Aug. 7, 2008

(51) Int. Cl.
G05F 1/10 (2006.01)
(52) U.S. Cl. ..................... 327/535; 327/538; 327/540
(58) Field of Classification Search ................. None
See application file for complete search history.

(56) References Cited

U.S. PATENT DOCUMENTS

| | | | |
|---|---|---|---|
| 4,417,470 A | 11/1983 | McCracken et al. | |
| 5,375,146 A | 12/1994 | Chalmers | 375/350 |
| 5,451,894 A | 9/1995 | Guo | 327/241 |
| 5,457,719 A | 10/1995 | Guo et al. | 375/373 |
| 5,737,342 A | 4/1998 | Ziperovich | 371/25.1 |
| 5,844,826 A | 12/1998 | Nguyen | 364/715.1 |
| 5,852,616 A | 12/1998 | Kubinec | 371/21.1 |
| 6,058,502 A | 5/2000 | Sakaguchi | 714/811 |
| 6,070,074 A | 5/2000 | Perahia et al. | 455/430 |
| 6,076,157 A | 6/2000 | Borkenhagen et al. | 712/228 |
| 6,111,414 A | 8/2000 | Chatterjee et al. | 324/633 |
| 6,125,334 A | 9/2000 | Hurd | 702/60 |
| 6,141,762 A | 10/2000 | Nicol et al. | 713/300 |
| 6,212,544 B1 | 4/2001 | Borkenhagen et al. | 709/103 |
| 6,625,635 B1 | 9/2003 | Elnozahy | 709/102 |
| 6,897,673 B2 | 5/2005 | Savage et al. | 324/765 |
| 7,093,109 B1 | 8/2006 | Davis et al. | 712/228 |
| 7,096,140 B2 | 8/2006 | Norzuyama et al. | 702/117 |

(Continued)

FOREIGN PATENT DOCUMENTS

CN 1716161 1/2006

(Continued)

OTHER PUBLICATIONS

Gupta and Rincon-Mora, "Predicting the Effects of Error Sources in Bandgap Reference Circuits and Evaluating Their Design Implications".

(Continued)

*Primary Examiner*—Tuan Lam
*Assistant Examiner*—Hiep Nguyen
(74) *Attorney, Agent, or Firm*—Joscelyn G. Cockburn; Thomas E. Tyson; Mark E. McBurney

(57) ABSTRACT

Measurement circuit components are included in an integrated circuit fabricated on a semiconductor substrate. These measurement circuits include registers that are connected to a voltage regulation circuit that provides the integrated circuit voltage source and to a power management circuit. These measurement circuits provide signals to control the voltage regulation circuit for adjusting the voltage output to the integrated circuit based upon a measurement values obtained on the semiconductor device. These measurements include temperature, IR drop at locations on the semiconductor substrate, along with the frequency response of integrated circuit.

9 Claims, 9 Drawing Sheets

U.S. PATENT DOCUMENTS

| | | | |
|---|---|---|---|
| 7,100,061 B2 | 8/2006 | Halepete et al. | 713/322 |
| 7,174,194 B2 | 2/2007 | Chauvel et al. | 455/574 |
| 7,184,936 B1 | 2/2007 | Bhandari | 702/189 |
| 7,228,446 B2 | 6/2007 | Jorgenson et al. | |
| 7,282,966 B2 | 10/2007 | Narendra et al. | 327/99 |
| 7,307,439 B2 | 12/2007 | Takamiya et al. | 324/763 |
| 7,330,081 B1 | 2/2008 | Asa et al. | 331/57 |
| 2002/0046399 A1 | 4/2002 | Debling | 717/138 |
| 2002/0065049 A1 | 5/2002 | Chauvel et al. | 455/66 |
| 2003/0030483 A1 | 2/2003 | Seki et al. | 327/540 |
| 2003/0057986 A1 | 3/2003 | Amick et al. | 324/760 |
| 2003/0126476 A1 | 7/2003 | Greene et al. | 713/300 |
| 2003/0184399 A1 | 10/2003 | Lanoue et al. | 331/176 |
| 2004/0023688 A1 | 2/2004 | Bazarjani et al. | 455/557 |
| 2004/0090216 A1 | 5/2004 | Carballo et al. | 323/234 |
| 2004/0183613 A1 | 9/2004 | Kurd et al. | 331/186 |
| 2004/0268280 A1 | 12/2004 | Eleyan et al. | 716/6 |
| 2005/0116733 A1 | 6/2005 | Barr et al. | 324/763 |
| 2005/0174102 A1 | 8/2005 | Saraswat et al. | 324/102 |
| 2005/0278520 A1 | 12/2005 | Hirai et al. | 713/1 |
| 2005/0289367 A1 | 12/2005 | Clark et al. | 713/300 |
| 2006/0066376 A1 | 3/2006 | Narendra | |
| 2006/0149974 A1 | 7/2006 | Rotem et al. | 713/300 |
| 2006/0197697 A1 | 9/2006 | Nagata | 342/22 |
| 2006/0247873 A1 | 11/2006 | Fung et al. | 702/64 |
| 2007/0036212 A1* | 2/2007 | Leung et al. | 375/238 |
| 2007/0074216 A1 | 3/2007 | Adachi et al. | 718/102 |
| 2007/0096775 A1* | 5/2007 | Elgebaly et al. | 327/105 |
| 2007/0192650 A1 | 8/2007 | Shiota | 713/600 |
| 2007/0260895 A1 | 11/2007 | Aguilar et al. | 713/300 |
| 2009/0021314 A1* | 1/2009 | Boerstler et al. | 331/66 |
| 2009/0085651 A1* | 4/2009 | Liu et al. | 327/539 |

FOREIGN PATENT DOCUMENTS

WO  WO 2006/072106 A2  6/2006

OTHER PUBLICATIONS http://en.wikipedia.org/wiki/Bandgap_voltage_reference.

Schweber, A/D and D/A Converters: Critical links that just keep getting better, Apr. 1989, 4 pages.

PCT International Search Report, mailed Jun. 16, 2008, for PCT application EP2008/050922, 4 pages.

* cited by examiner

DIGITAL ADAPTIVE VOLTAGE SUPPLY

RELATED APPLICATIONS

This application is related to the following co-pending U.S. patent applications filed on the same day as the present application and having the same assignee: "On-Chip Adaptive Voltage Compensation," Ser. No. 11/671,485; "Using Temperature Data for Instruction Thread Direction,"; "Using Performance Data for Instruction Thread Direction," Ser. No. 11/671,627; "Using IR Drop Data for Instruction Thread Direction," Ser. No. 11/671,613; "Integrated Circuit Failure Prediction," Ser. No. 11/671,599; "Instruction Dependent Dynamic Voltage Compensation," Ser. No. 11/671,579; "Temperature Dependent Voltage Source Compensation," Ser. No. 11/671,568; and "Fan Speed Control from Adaptive Voltage Supply," Ser. No. 11/671,555; each assigned to the IBM Corporation and herein incorporated by reference.

BACKGROUND OF THE INVENTION

1. Technical Field

The present invention relates in general to a system and method for regulating voltage to an integrated circuit contained on a semiconductor substrate. In particular, the present invention relates to a system and method for regulating voltage to an integrated circuit in response to digitally measured physical conditions of the integrated circuit while providing data to and receiving inputs from programmable control.

2. Description of the Related Art

The performance of integrated circuits varies during the manufacturing process. Traditionally, these integrated circuits, which are manufactured on semiconductor substrate wafers, are tested and graded upon manufacture completion to determine their performance. Upon being graded, the semiconductor substrates are packaged and sold based on this measure performance. This grading details predicted performance for a specified single voltage to be provided to the integrated circuit for all operating conditions.

The integrated circuit that marginally fails to meet the performance criteria is typically discarded, even though it is fully functional without any defect. This results in yield loss. One way to marginally increase the performance of an integrated circuit is to increase the nominal operating voltage applied to it. So to ensure minimum yield loss due to underperforming integrated circuit samples, they are packaged with a higher than nominal voltage specification marked on the package itself. However, this test for performance is done at a single operating point, i.e. at a fixed temperature and given process, a measurement is made to find out what is the voltage required to attain the minimum performance criteria. In a system though, the temperature and voltages are not constant, so to guard against these variations, a voltage even higher than that needed to achieve minimum performance criteria is actually stamped on the package as the nominal voltage.

Also, calibration of individual integrated samples takes up more test time that increases cost. In such a static test method, since the power supply voltage is set at wafer based on single operating point, the opportunity to reduce power dynamically is lost.

Therefore, there is no provision made for responding to changing operating system conditions of the integrated circuit after it has been graded and packaged.

SUMMARY

In accordance with the present invention, an integrated circuit apparatus is provided that includes a temperature measurement circuit within the integrated circuit that provides a temperature signal, a voltage drop measurement circuit within the integrated circuit providing a voltage drop value to a voltage drop register, a frequency measurement circuit within the integrated circuit providing a frequency value to a frequency register, a supervisor circuit connected to the voltage drop register and the frequency register and selectively reading values from or providing values to the voltage drop register and the frequency register, a voltage scaling signal circuit connected to the temperature measurement circuit, the voltage drop register and the frequency register and combining the temperature signal with the values of the voltage drop register and the frequency register to compute a voltage scaling signal value, and a voltage supply connected to the voltage scaling signal circuit and providing a voltage to the integrated circuit proportional to the voltage scaling value.

In one embodiment of the present invention, an electronic system is provided that includes a thermal diode, an addressing circuit connected to a system clock, a digital temperature table connected to the addressing circuit, a comparator connected to the digital temperature table and to the thermal diode, a predicted frequency response table connected to the output of the comparator and providing a predicted frequency response value, a first frequency circuit providing a first frequency value, a second frequency circuit providing a second frequency value, a first differencing circuit connected to the frequency response table and the first frequency circuit providing a first difference value of the first frequency value and the predicted frequency value, a second differencing circuit connected to the first frequency circuit and the second frequency circuit and providing a second difference value of the first frequency value and the second frequency value, a voltage scaling signal circuit connected to the first and second differencing circuits and providing a voltage scaling signal from a combination of the first and second difference values, and a voltage supply providing power to the electronic system in response to a voltage scaling signal received from the voltage scaling signal circuit.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
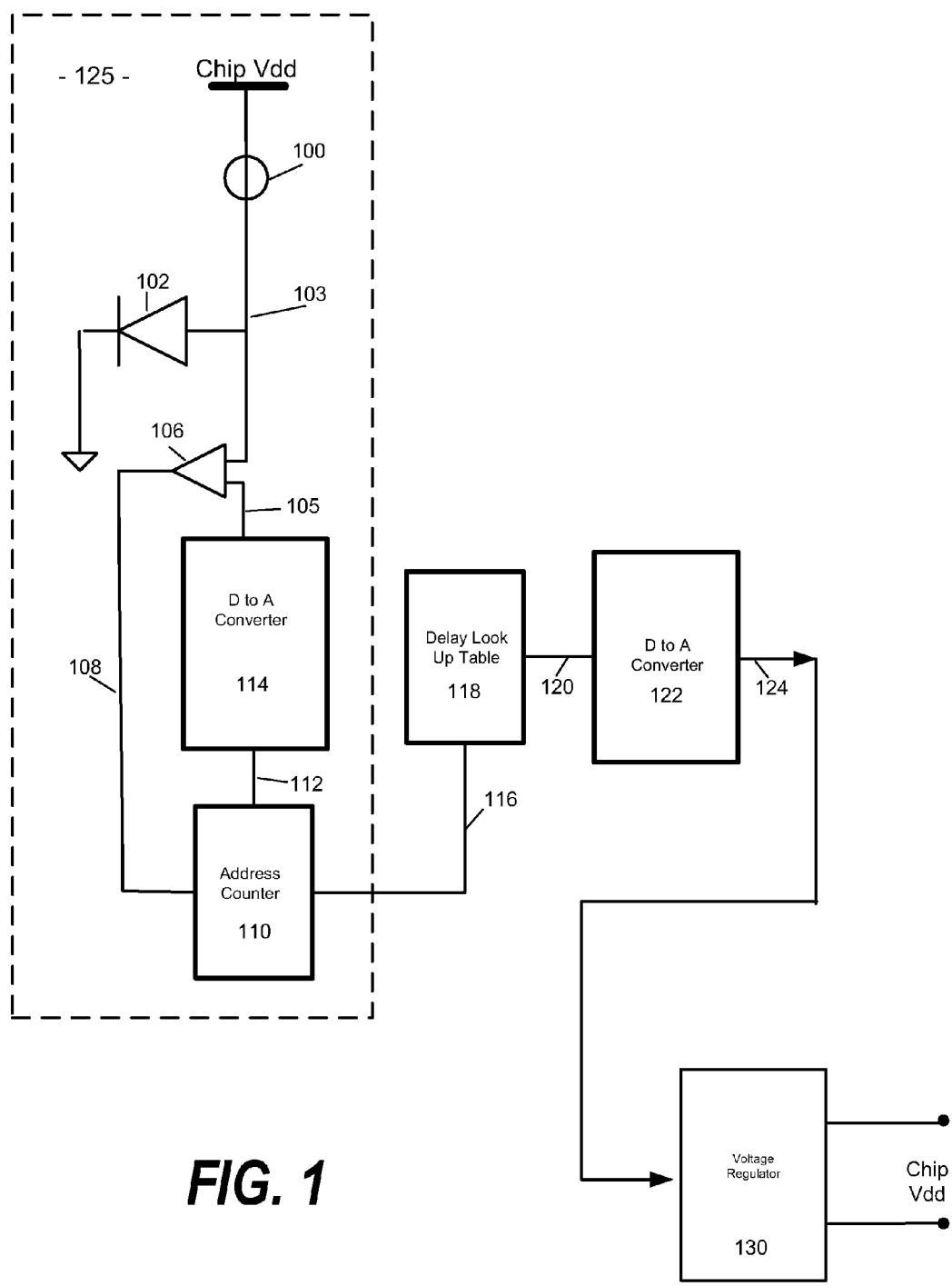
FIG. 1 is a schematic diagram of a simple embodiment of the temperature measurement circuit.

The following is intended to provide a detailed description of an example of the invention and should not be taken to be limiting of the invention itself. Rather, any number of variations may fall within the scope of the invention, which is defined in the claims following the description.

The present invention provides a system to measure temperature within a single central processing unit. This is actually accomplished by providing an adaptive power supply (APS) for each central processing unit. Each of these adaptive power supplies determines operating conditions on an integrated circuit and adjust voltage (Vdd) provided to the integrated circuit to either increase performance of the integrated circuit or save power expended by the integrated circuit.

In a preferred embodiment of these adaptive power supplies, three physical condition measurements are made. The first is temperature, which is measured by a thermal diode on the surface of the integrated circuit. The second is the IR (voltage) drop measured by two ring oscillator circuits and the third is the frequency performance of the integrated circuit measured by a single loop oscillator compared to stored predetermined performance values.

The complete control signal provided to the voltage regulation circuit is:

Total *Vdd* scaling=Frequency response scaling+Temperature related *Vdd* scaling+*IR* drop related scaling All of the measurement circuits are contained on the surface of this integrated circuit device in the preferred embodiment. These measurements are then used to scale an input control signal to a voltage regulation circuit also contained on the surface of the integrated circuit device or alternatively on another integrated circuit. The output of this voltage regulation device provides the integrated circuit operating voltage (Vdd). Thus the voltage supplied to the integrated circuit can be adjusted to either save power or increase performance dynamically during the operation of the chip by under program control. Further the integrated circuit voltage and, therefore, performance can be changed in anticipation of operating environment changes such as a sleep state or the execution of instructions requiring high circuit performance.

This is a dynamic method of varying voltage that takes into account the specifics of the semiconductor manufacturing process, temperature and IR drop effects simultaneously. This method uses available on-chip data to compute adjustment in voltage necessary to either meet target performance or decrease power consumption. The two goals are met using the same circuit. Another advantage of using this method is the flexibility it offers to the users in terms of programmability. On chip voltage can be artificially varied by writing into special registers which provide values used by the power management circuitry to provide the supply voltage Vdd. This feature can be helpful when expecting instructions that require high circuit performance, essentially providing an "on-Demand" performance capability. In other words, to provide on request, additional circuit supply voltage to increase circuit performance.

This method is not limited to a specific technology or type of circuit. It can be applied to a broad type of integrated circuits, especially those that need to deliver higher performance at lower power consumption.

This method also offers reduction in test time for identifying yield and voltage per module. It is a dynamic solution unlike previous static solutions (fuses, etc) that takes into account effects of IR drop.

FIG. 1 is a schematic diagram of one embodiment of the thermal measurement circuit 125 shown connected to the voltage regulation circuit which provides the integrated circuit voltage source (Chip Vdd). This measurement circuit includes a current source 100 connected to the voltage source. This current source 100 is also connected by a line 103 to a thermal diode 102 also connected to ground. The voltage across the thermal diode 102 indicates the measured temperature of this integrated circuit. This thermal voltage signal is provided over line 103 to an analog comparator 106. The output of the comparator 106 is connected to an address counter 110 providing an address to a digital to analog (D to A) converter 114. The operating range for a thermal diode is commonly zero to 125° C. The address counter 110 includes a look up table with 128 entries. These entries correspond to 0° C. to 127° C. Initially, the address counter 110 starts at zero degrees and increments upward each clock cycle. Each address is provided to the D to A converter 114 over line 112. In operation, the analog comparator 106 compares the output of the D to A converter 114 with the measured thermal voltage provided by the thermal diode 102. When the address counter 110 provides an output representing the same temperature as the thermal diode 102, the output voltage from the D to A converter 110 will be the same voltage as that provided by the thermal diode 102. The output of the analog comparator 106 will then be zero. The address counter 110 will then stop incrementing and provide a signal over line 116 to a delay lookup table (LUT) circuit 118. This value on line 116 is a digital signal representing the temperature measured by the thermal diode 102. This thermal voltage value is used to address a corresponding delay value in the delay lookup table circuit 118. The delay lookup table in circuit 118 is a table of pulse width values computed by a simulation of the performance of the integrated circuit. Each value represents the expected delay value computed for the temperature range of 0° C. to 127° C. for expected integrated circuit performance.

To measure the process on the substrate, a ring oscillator connected to a temperature compensated voltage source (ex: a bandgap reference) is used. In this case, for a given temperature, the pulse width produced by the ring oscillator is a function of the process on the substrate since temperature and voltage are constant. By using a bandgap reference, the voltage applied to a ring oscillator can be kept constant. But the temperature of the substrate depends upon internal and external operating conditions and it cannot be held constant. To eliminate the effects of varying temperature, another scheme is used in this invention.

First, a target predicted circuit performance number (pcpn) is chosen. This number represents the expected circuit performance based on expected semiconductor manufacturing process. This number represents circuit performances expected under nominal applied voltage across the entire operating temperature range. For this pcpn, a simulation of the ring oscillator supplied by a constant voltage from a bandgap reference is carried out for the entire operating temperature range. This simulation yields pulse widths that are generated at a fixed voltage and pcpn values where only the temperature is varied across the entire operating temperature range. If the substrate pcpn is identical to the desired target performance, then the substrate would also yield identical pulse widths for each value of the operating temperature range.

If the substrate pcpn is different than the desired target performance, then the pulse widths produced by the substrate will be either shorter or longer than those produced by simulation depending upon whether the substrate pcpn was faster or slower than the desired target performance. So a comparison has to be made between the pulse width generated by the ring oscillator on the substrate with a simulated value of the pulse with at the value of the substrate temperature at a fixed voltage. The expected pulse width values at the desired target process for each temperature value within the desired operating temperature range are stored in a Look Up Table (LUT) (for example, 118 in FIG. 1) that is addressed by the current substrate temperature, i.e. based on the substrate temperature, the address pointer points to an entry in the LUT that contains the expected pulse width from the ring oscillator circuit at the desired process corner at a fixed bandgap voltage. For this invention, the operating temperature range is 0° C. to 127° C. and this range is divided into 128 steps of 1° C. each. This requires 128 entries in the LUT, one entry corresponding to each 1° C. rise in temperature.

This resulting pulse width value from the delay lookup table circuit 118 provides a voltage scaling signal in digital form which is converted to an analog voltage signal by D to A converter 122. This scaling voltage signal is provided to a voltage regulator 130 over line 124. The operation result of the circuit 125 would be to increase or decrease the resulting voltage of regulator circuit 130 (chip Vdd) based upon the measured temperature of the integrated circuit measured by thermal diode 102.

Figure 2:
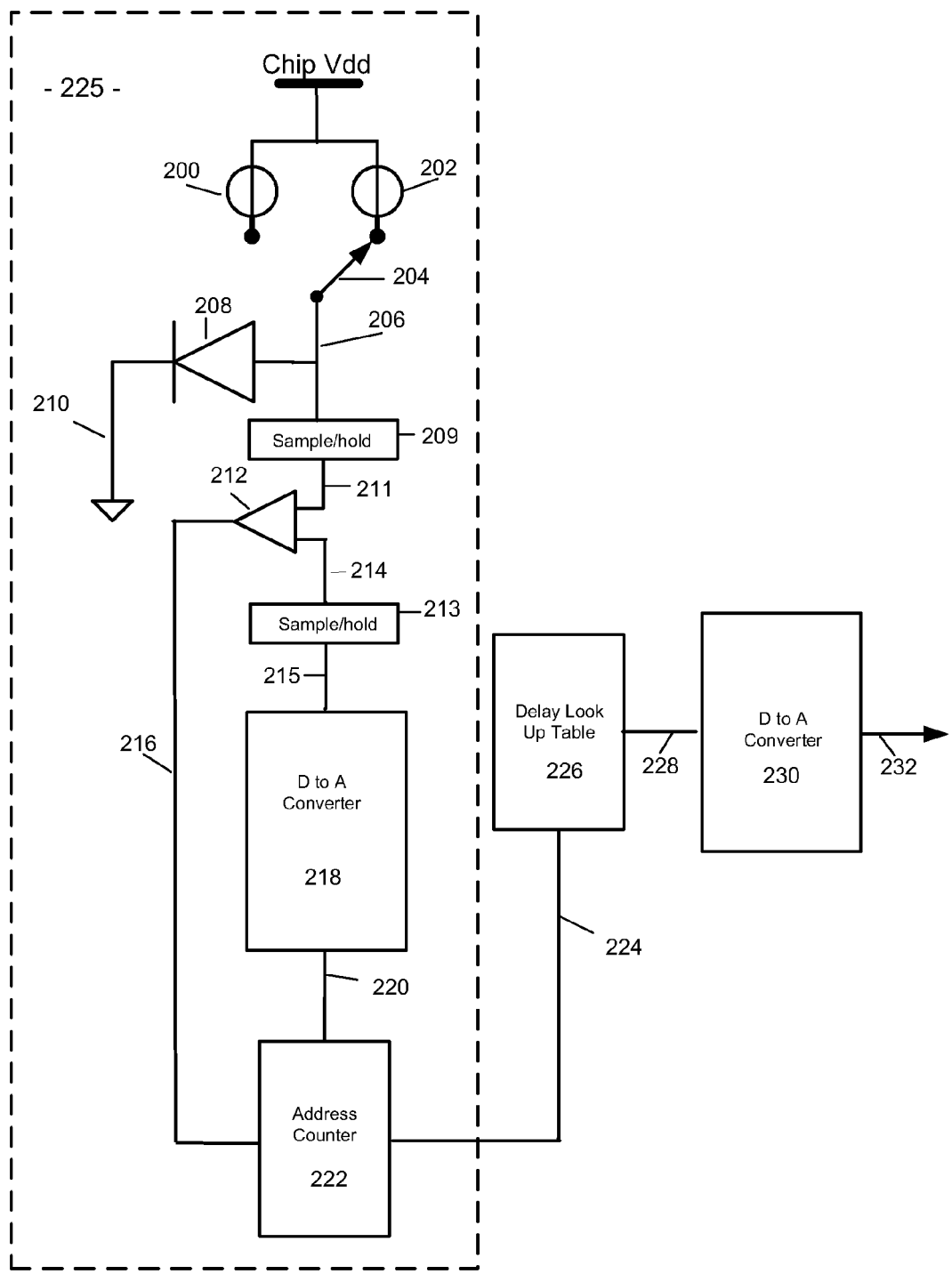
FIG. 2 is a schematic diagram of a second embodiment of the temperature measurement circuit.

FIG. 2 is a second embodiment of the thermal measurement circuit illustrated in FIG. 1. The temperature measurement circuit 225 of FIG. 2 includes two current sources 200 and 202 which are selectively connected to a thermal diode 208 through a switch 204 connected by line 206. The diode is actually made up of a lateral PNP device fabricated in CMOS technology. The collector and base of this device are shorted leaving the diode between base and emitter.

Digital temperature sensors are based on the principle that the base-emitter voltage, $V_{BE}$, of a diode-connected transistor is inversely proportional to its temperature. When operated over temperature, $V_{BE}$ exhibits a negative temperature coefficient of approximately −2 mV/° C. In practice, the absolute value of $V_{BE}$ varies from transistor to transistor. To nullify this variation, the circuit would have to calibrate each individual transistor. A common solution to this problem is to compare the change in $V_{BE}$ of the transistor when two different current values are applied to the emitter of the transistor.

Temperature measurements are made using a diode that is fed by 2 current sources, one at a time. Typically the ratio of these current sources is 10:1. The temperature measurement requires measuring the difference in voltage across the diode produced by applying two current sources.

Line 206 is connected to a "sample and hold" circuit 209 to sample and hold a voltage output of the thermal diode 208. The address counter circuit 222 operates identically to the address counter, circuit 110 of FIG. 1 previously discussed. Address counter circuit 222 increments an address every clock cycle which provides a digital signal representing the temperature range of 0° C. to 127° C. over line 220 to the D to A converter 218 which converts this digital signal representing temperature to a voltage. This voltage signal is provided on line 215 to a second sample and hold circuit 213. Both the sample of the hold circuits 209 and 213 will sample and hold their respective voltages for the comparator 212 so that continuing small variations in temperature from the thermal diode 208 will not adversely affect the operation of this temperature measurement circuit 225. Upon reaching the measured temperature, the comparator 212 will provide a zero output over line 216 to the address counter 222 which provides a digital signal representing the measured temperature on line 224 to the delay lookup table circuit 226. The operation of the delay lookup table circuit 226 providing a digital delay value on line 228 to the D to A converter 230 is the same as previously discussed for the measurement circuitry 125 in FIG. 1.

Figure 3:
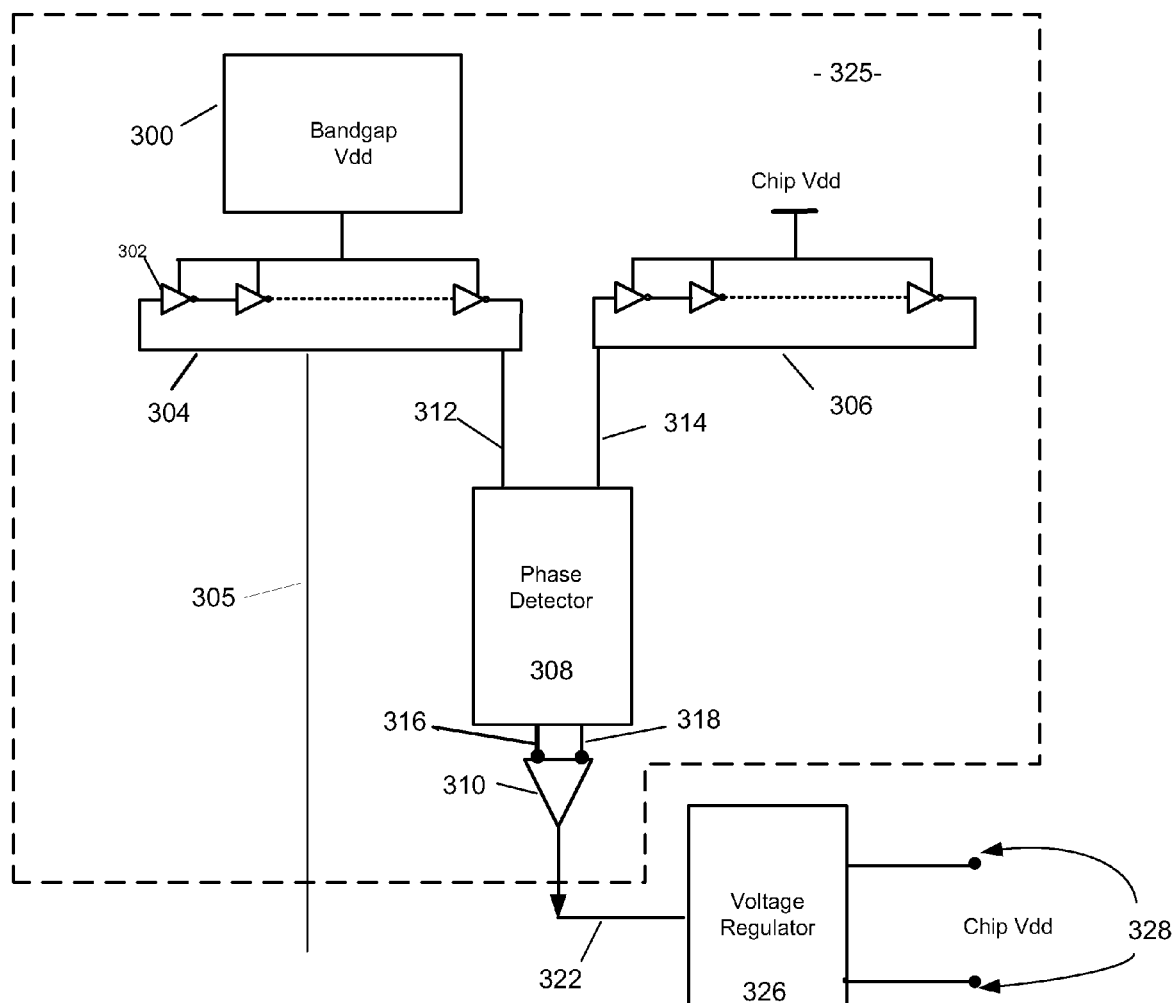
FIG. 3 is a schematic diagram of the two ring oscillator circuit that provides input for the frequency response measurement and provides the IR drop measurement.

FIG. 3 is a schematic diagram of the IR drop measurement circuit 325 which provides voltage scaling signal to a voltage regulator circuit 326. A band gap voltage source 300 is connected to a ring oscillator circuit 304. The ring oscillator circuit 304 consists of an odd number of inverters 302 connected in a loop or ring. The band gap source is obtained from the physical integrated circuit itself and is nominally 1.23 volts. A second ring oscillator circuit 306 connected to the chip voltage source provides an output on line 314. The band gap ring oscillator provides an output on line 312. A phase detector 308 is connected to lines 312 and 314 to determine the difference or delay between the pulses provided by the two ring oscillator circuits 304 and 306. The phase detector 308 provides a voltage magnitude output and a voltage polarity output on lines 316 and 318 respectively which in combination represent the delay difference between the ring oscillator circuits 304 and 306. Lines 316 and 318 are input to a comparator 310 which provides a voltage scaling signal on line 322 to the voltage regulator 326. It should be understood that this voltage scaling signal on line 322 is based solely upon the IR drop of the integrated circuit. Based on the voltage scaling signal of line 322, voltage regulator 326 provides the appropriate chip Vdd value. In the preferred embodiment, the two ring oscillator circuits 304 and 306 should be located in close proximity to each other so that the effects of any irregularities across the surface of the integrated circuit will be minimized.

The frequency response of the integrated circuit (or performance of the integrated circuit) can be measured by using the output of a band gap voltage connected ring oscillator 304 on line 305 of FIG. 3 and the lookup table containing known delay values based on chip temperature from circuit 226 of FIG. 2. This is illustrated in combination with the IR drop measurement of circuit 325 and the temperature measurement of circuit 225 in FIG. 4. In the IR drop measurement circuit 325, the band gap connected ring oscillator 304 provides a second signal connected to an integrator circuit 414, which takes the pulse signal from the band gap connected ring oscillator 304 of circuit 325 and converts it into a voltage which is then provided to difference circuit 416. Another input line 415 to the difference circuit 416 is compared to the delay voltage signal output from the D to A converter 230 representing the expected delay based on the measured temperature. The output of this difference circuit 416 represents a voltage indicative of the integrated circuit frequency response or performance of the integrated circuit. More specifically, this signal provided to multiplexer 418 represents the actual integrated circuit performance compared to the expected integrated circuit performance for that temperature. If the expected delay signal on line 415 is less than the delay signal from integrator circuit 414, the chip is performing below expectations and the voltage Vdd should be increased. Conversely, if the expected delay on line 415 is greater than the delay signal from integrator circuit 414, the chip is performing above expectations and the voltage Vdd could be lowered to save power.

Figure 4:
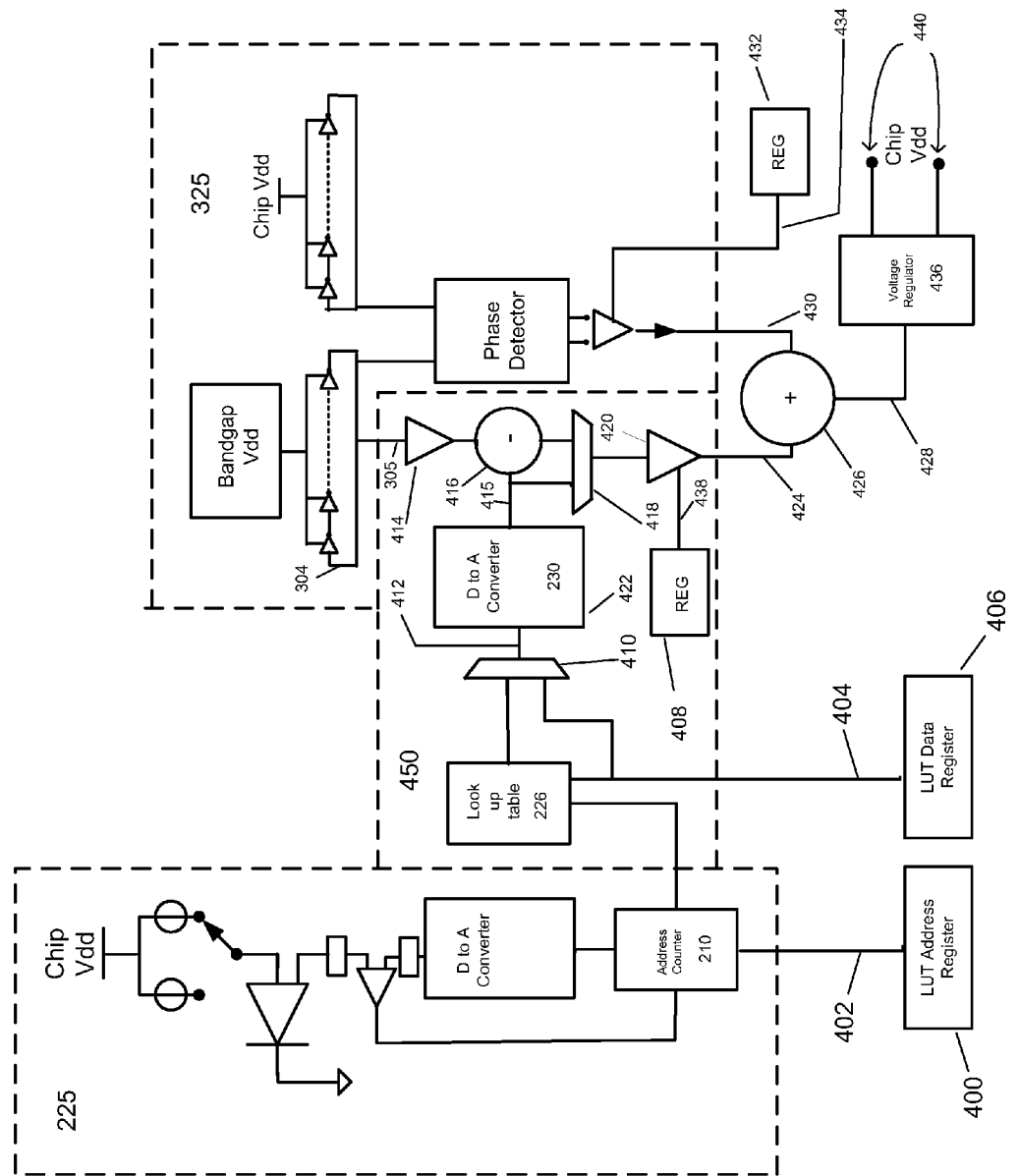
FIG. 4 is a schematic diagram of the preferred embodiment of the adaptive voltage compensation circuit.

FIG. 4 also illustrates the preferred embodiment of the invention combining the temperature measurement circuit 325 output, the IR drop measurement circuit 325 output with the frequency response measurement as discussed above. In this embodiment, the temperature measurement circuit includes a lookup table address register 400 connected to the address counter 210 by line 402 to provide an initial address or to provide an artificially changed temperature that would result in an artificially changed voltage scaling signal. Also, the lookup table data register 406 is provided that may provide a directed input into the delay lookup table 226 shown in block 450 where block 450 also contains other circuit elements for frequency response measurement. This can be used to provide entries into the delay lookup table or provide bypass data output directly to multiplexer 410 which is input to the D to A converter 230. In this manner, a programmer could directly control the delay value, which is used to compute the voltage scaling signal on line 428. The output of the D to A converter 230 is provided on line 415 directly to the difference circuit 416 and to the multiplexer 418. In this manner the multiplexer 418 may bypass the difference circuit 416 and only provide the temperature dependant table delay value to the driver 420. The driver 420 is connected to a register 408 by line 438 which can be used to control the amount of signal output on line 424 to the summing circuit 426. Likewise, in circuit 325, register 432 provides on line 434, a signal that can be used to vary the amount of the scaling signal output from the circuit 325 to the summing circuit 426. The output from summing circuit 426 is the voltage scaling signal on line 428 and is provided to the voltage regulator 436 which in turn provides the integrated circuit voltage (chip Vdd) 440.

Figure 5:
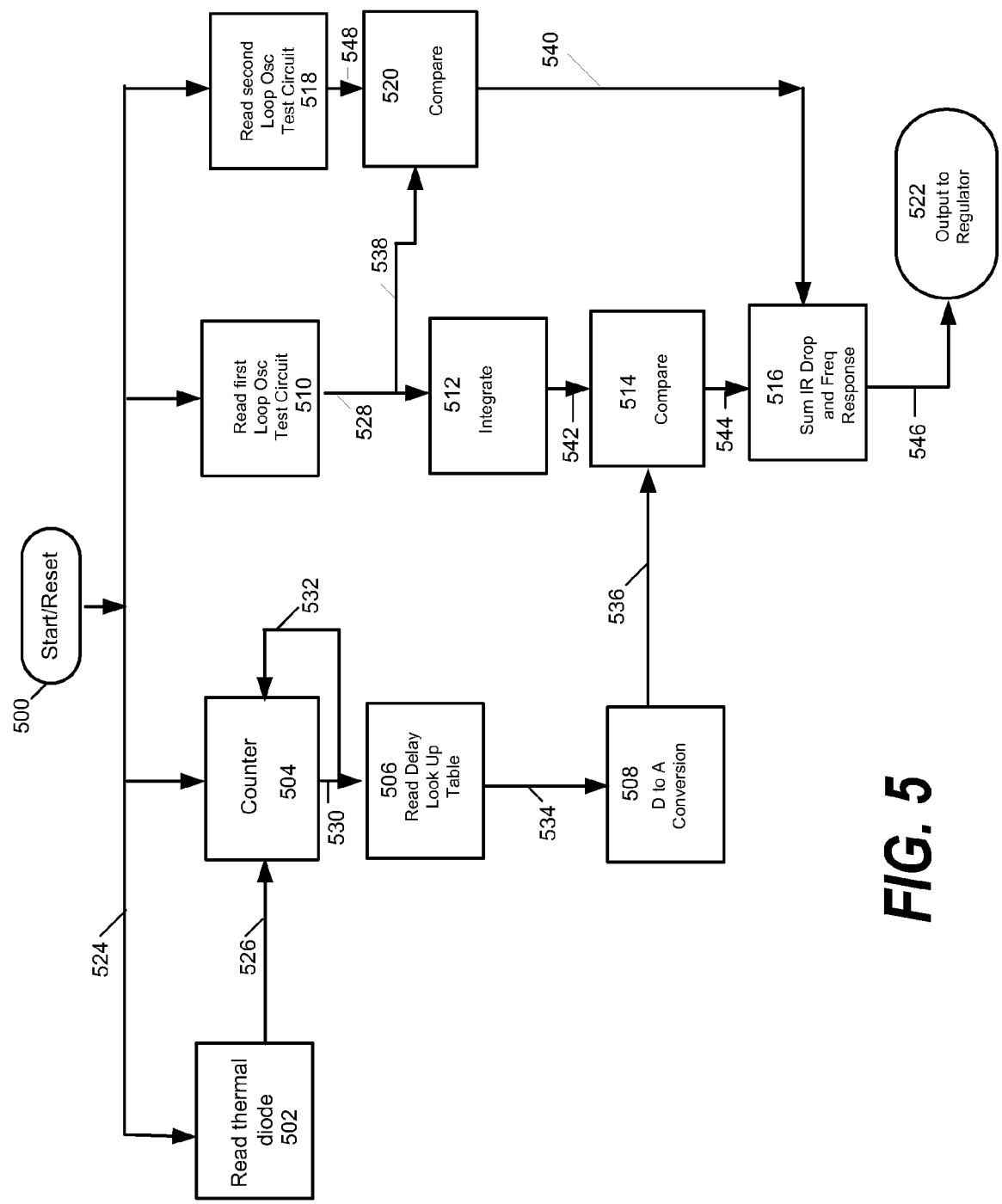
FIG. 5 is a flow chart representing the operation of the adaptive voltage compensation circuit.

FIG. 5 is a process flow chart representing the operation of the invention. It is important understand, that FIG. 5 is not a flow chart representing software execution but of a simultaneous process producing the voltage scaling signal previously discussed in the operation of the different functional units of the present invention. The discussion of this flowchart of FIG. 5 will also reference FIGS. 2, 3 and 4 respectively. In the start phase 500, path 524 illustrates the simultaneous operation of the different aspects of this invention. In step 502, the thermal diode 208 provides an output voltage indicating the measured circuit temperature on line 506 to process block 504. Process block 504 represents the operation of the address counter 222, the D to A converter 218 and the voltage comparator 212 (of FIG. 2) in determining a digital signal representative of the circuit temperature as previously discussed. Referring to FIG. 5, this digital temperature is provided on path 530 to the delay lookup table in step 506 which provides a digital signal representative of the delay on path 534 to the D to A conversion step 508 resulting in the delay signal voltage provided to the comparator 514 over path 536.

Returning to path 524, the frequency response value measured in block 510 is provided in path 528 to both the integration block 512 and to the compare block 520 by line 538 as discussed in FIG. 4. The integration circuit 414 of FIG. 4 provides the frequency response measurement signal to the compare block 514 over path 542 which is then compared to the delay signal on path 536. This result of this comparison is provided on path 544. Returning to path 524, the measurement of the IR drop from the ring oscillator 306 connected to the chip voltage supply is compared with the ring oscillator 304 connected to the band gap voltage source in step 520. The output on path 540 represents the IR drop portion of the voltage scaling signal and is combined in step 516 to produce the overall voltage scaling signal 546 provided to the regulator 436 in step 522. It is important understand that this voltage scaling signal results from the combination of the measurements for temperature, IR drop and circuit frequency response.

Digital Implementation of the Adaptive Voltage Supply

Figure 6:
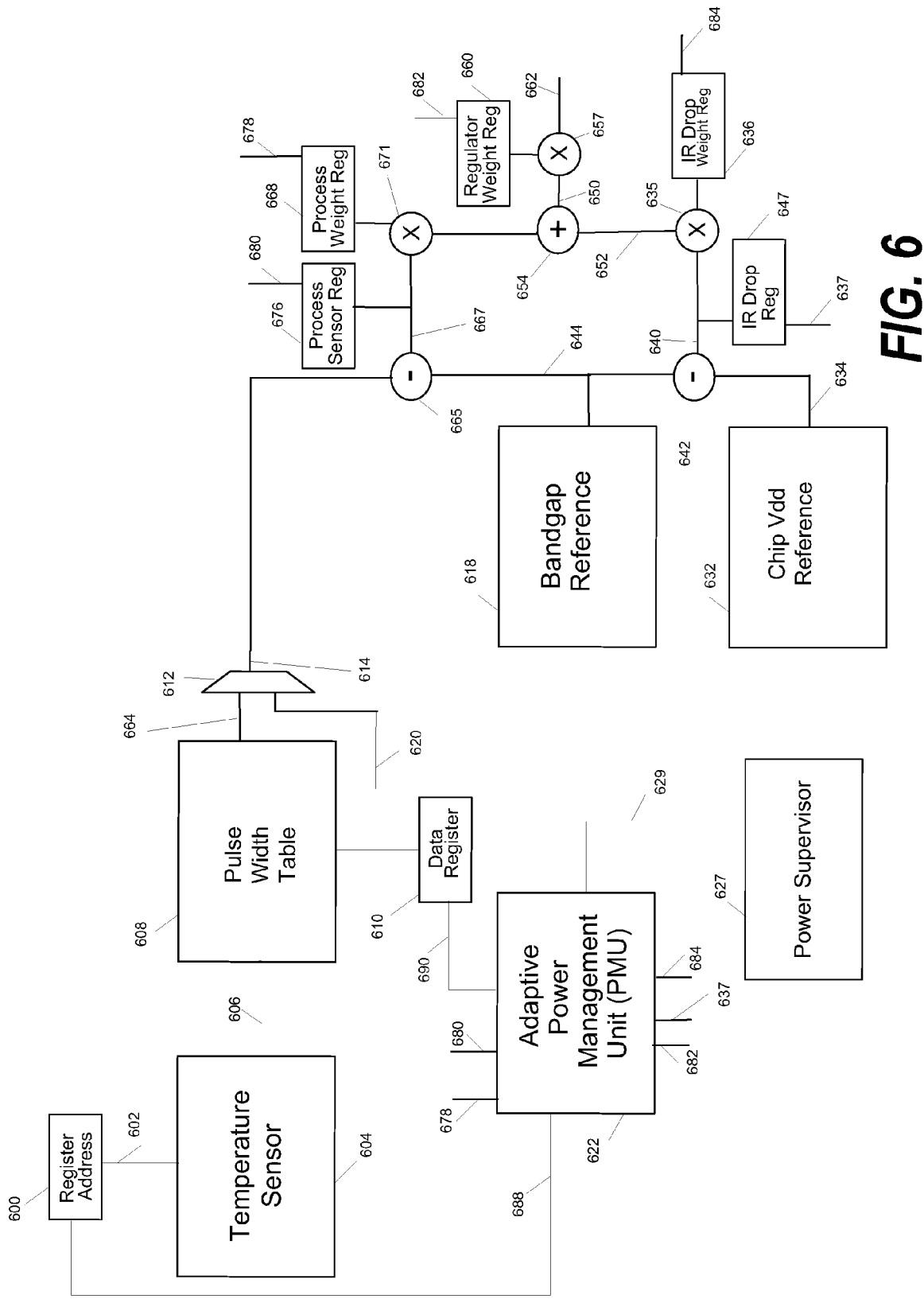
FIG. 6 is a block diagram of a digital implementation of the adaptive voltage compensation circuit.

FIG. 6 is a block diagram of an embodiment of the digital adaptive voltage supply. Block 604 represents the temperature sensor previously discussed in FIGS. 1, 2 and 4. Register 600 provides an address into the temperature sensor tables, as previously discussed. The output of the temperature sensor block 604 on line 606 is provided to the pulse width table 608. This table 608 is also connected by line 622 to a data register 610. The data register 610 provides the ability to input a value into either the pulse width table 608 or to the multiplexer 612. In this manner, the adaptive power management unit 622 may provide inputs into data register 610 which is substituted by a multiplexer 612 for a pulse width value. In other words, a computer program providing control of the operation of the adaptive power management unit 622 can directly control the value in the data register 610 and thus indirectly control the voltage scaling computation from this point in the block diagram.

The bandgap reference circuit 618 and the Vdd reference circuit 632 are similar to those discussed and illustrated as block 325 in FIG. 4. However, the output of the bandgap reference circuit 618 and chip Vdd reference circuit 632 are combined in a difference circuit 642 that provides an output on line 640. The bandgap reference circuit 618 also provides an output that is combined with the output from the multiplexer 612 in the difference circuit 665. This difference circuit 665 provides an output on line 667.

One distinction from the adaptive voltage supply illustrated in FIG. 4 is the inclusion of the process sensor registers 676 connected to line 667 and the IR drop register 647 connected to line 640. Since the data on lines 667 and 640 are digital, these registers 676 and 647 may receive the values on these lines respectively. Alternatively, register 676 can receive an input on line 680 as can register 647 receive an input on line 637. In other words, both these registers are read/write registers. Returning to line 667, its value is input to a multiplier circuit 671 which receives an input from register 668 that provides a weighting value. In this embodiment, a weighting value can be used to increase or decrease the influence of the process number that results from either the difference circuit 665 or the process sensor register 678. Registers 668 receives an input on line 678 from the adaptive power management unit 622. The result of the multiplier circuit 671 is provided to the adding circuit 654. Line 640 also provides an input to a multiplier circuit 635 which receives a weighting value from the IR drop weight register 636. Like the process weight register 668, the IR drop weight register 636 receives an input on line 684 from the adaptive power management unit 622. The output of multiplier 635 is provided to the summing circuit 654 on line 652. The output from the summing circuit 654 is provided on line 650 to another multiplier 657, which is connected to a regulator weight register 660. This register, connected by line 682 to the adaptive power management unit allows program control of output of the scaling signal of the power supply itself. Therefore, by providing a weighting value in the register 660, the output on line 662 of the overall scaling circuitry can be regulated. Also in FIG. 6, there is a power supervisor circuit 627 which represents the interface to the computing system that permits for overall will control over this digital adaptive voltage supply through line 629 to the adaptive power management unit 622. The registers 600, 610, 676, 668, 660, 636, and 647 are read/write registers. Thus, the power supervisor 627 through the adaptive power management unit 622 can exercise total monitoring and regulation over the operation of the digital adaptive voltage supply.

Figure 7:
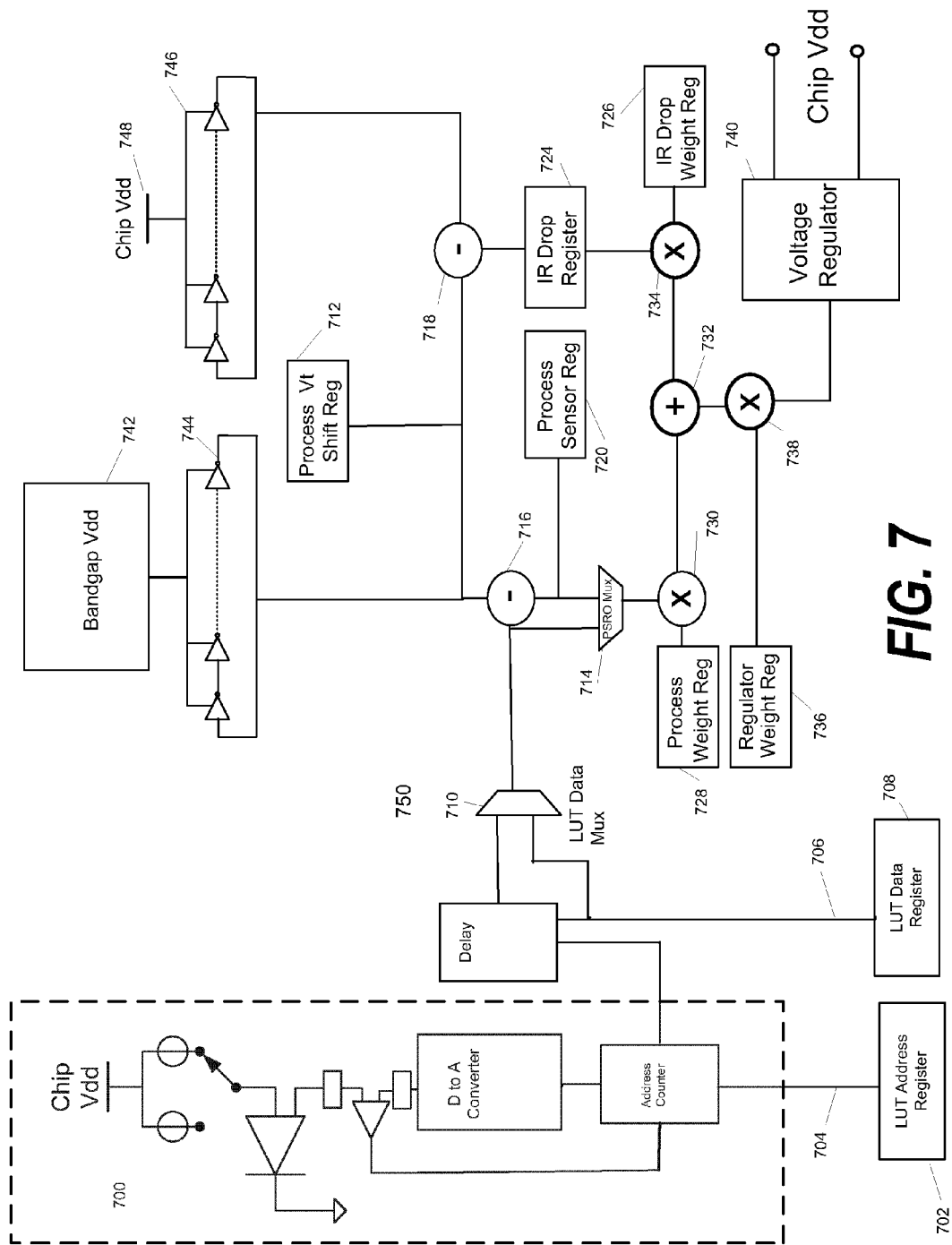
FIG. 7 is a second and more detailed block diagram of the implementation of FIG. 6.

FIG. 7 is a more detailed diagram of the block diagram of FIG. 6 further showing the Process Vt device threshold voltage shift. As the part ages, the Vt shifts for its devices resulting in slower performance. This register 712 connected to the differencing circuit 718 which stores. The Process Vt shift register 712 stores the pulse width value generated by the ring oscillator 744. As the part ages, for the same value of temperature and at bandgap voltage, the value written into this register will become larger indicating that the part is slowing down. By periodically comparing the value stored in this register with a pre-calculated pulse width value (estimated at 80% of the final pulse width achieved at End of Life for the part) for a given temperature, it can be determined when the part has reached the 80% point of its End of Life Vt shift and a signal will be generated indicating that this part may need to be replaced soon. In one embodiment, this register 712 is a read-only register where the value is written into the register based upon user control (i.e. a user can decide when the ring oscillator 744 pulse width data can be written into this register 712, but the user cannot write or overwrite the value of this register 712).

Figure 8:
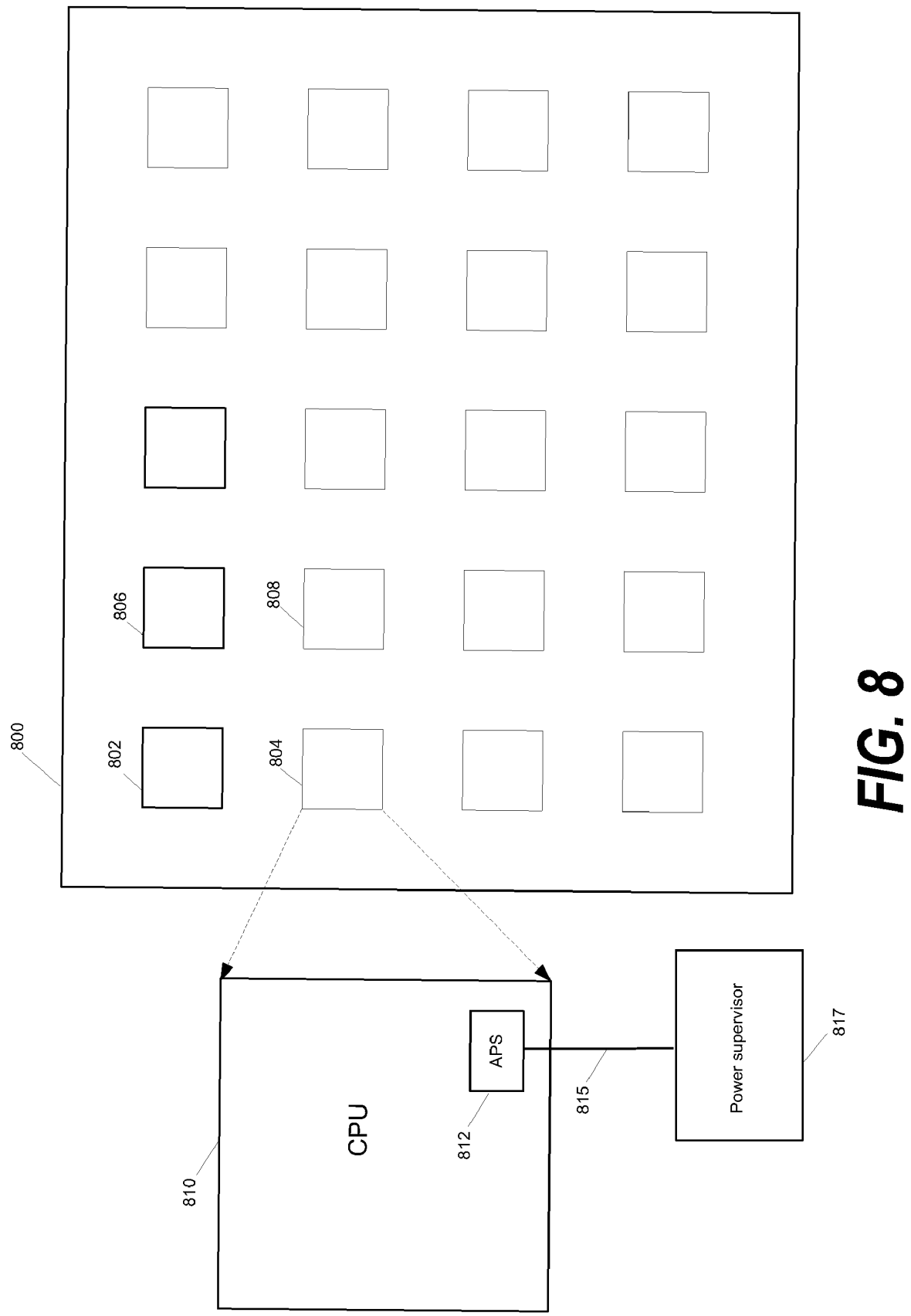
FIG. 8 is an illustration of the location of adaptive voltage compensation circuits on multiple cores.

FIG. 8 is a diagram illustrated embodiment, where multiple CPU cores are located on a single semiconductor substrate 800. Each of the cores 802, 804, 806 and 808 are identical in this illustrated embodiment. However it should be apparent that the functionality of the cores is not relevant to the application of this invention as long as individual adaptive voltage supplies are located in each of the cores. In FIG. 8, the view of CPU core 804 is exploded into a view 810 that includes the CPU itself plus, on the surface of this core, an adaptive voltage supply 812 connected by a line 815 to a power supervisor 817. In operation, the power supervisor 817 represents the programmable control over all of the adaptive voltage supplies on all of the cores in the system. By using the registers discussed in FIGS. 6 and 7, the power supervisor 817 can control and monitor the operation of each adaptive voltage supply.

Figure 9:
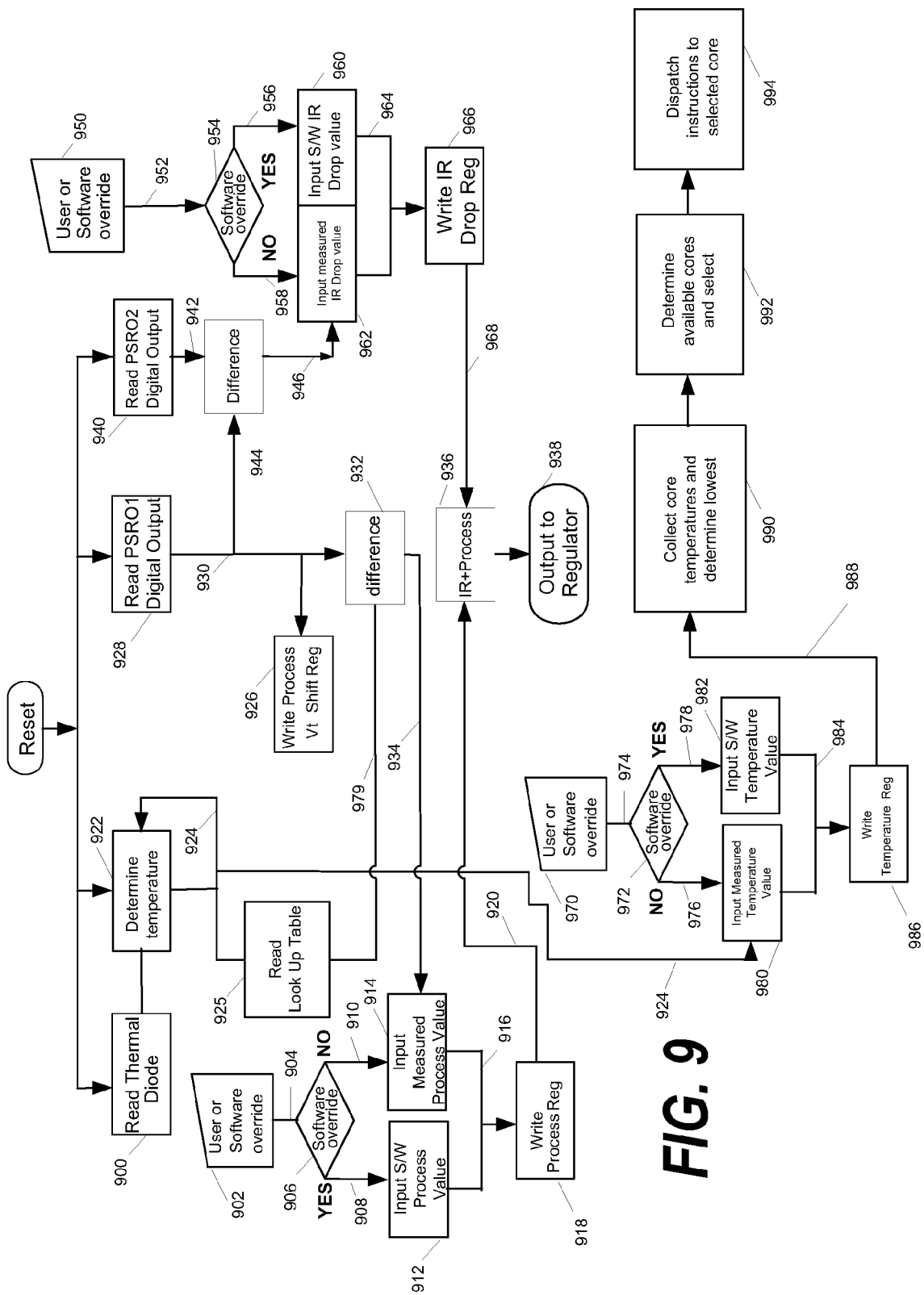
FIG. 9 is flow diagram illustrating how programmable control is provided to the adaptive voltage compensation circuit.

FIG. 9 is a flowchart illustrating the operation of the power supervisor in controlling the adaptive voltage supply. The thermal diode voltage is read in step 900 which is connected to the counter 922 that incrementally addresses the lookup table in step 925 to determine the measured temperature value which is provided to the differencing block 932 by line 979 which is also connected to the measured value register 980. Simultaneously, the first process sensing ring oscillator is read in block 928. This frequency with value is provided on line 932 to the write process shift register 926 and a difference circuit 932. Also simultaneously, the second process sensor ring oscillator circuit is read in block 940. Its output is provided on line 942 to the difference circuit 944 where the difference between the first and second ring oscillator circuits is provided on line 946.

FIG. 9 illustrates software control over the adaptive voltage supply previously discussed. Block 950 initiates the software or override capability through decision 954 from line 952. If a software or override is to take place, then the input measured IR drop value in block 962 would not be provided, but rather a software input value in block 960 would be provided over line 964 to the IR drop register 966.

In a similar manner, block 902 controls the process value that is used by the adaptive voltage supply. When a software control is implemented, a signal is provided on line 904 to the decision block 906. If an override by a software input is to take place, then the software input value in block 912 is provided by line 916 to the write process register 918 instead of the measured process of block 914. As shown, the inputted measured process value in block 914 is received via line 934 from the difference circuit 932 at this point. The software controls both the write process register in block 918 and the write IR drop register in block 966. Both the IR drop data and the process data are summed in block 936 to provide the overall voltage scaling signal that is output to the voltage regulator at 938 to provide the Vdd supply voltage to the integrated circuit.

Also in a similar manner, block 970 provides a user or software override in order to provide a substituted temperature value in place of the measured temperature value. This is done by providing a signal on line 974 to a decision process 972. If the software is to override the measured value, a signal is sent online 978, to access the software provided temperature value in block 982, which is written by line 984 into the write temperature register 986. However if there is no software override, the decision block 972 provides a signal on line 976 to the register 980 which receives the temperature from line 924 as previously discussed.

It should also be apparent to those skilled in the art that the use of weight registers also provides a greater degree of software control over the operation of the adaptive voltage supply. Therefore by accessing these registers, the power supervisor can both monitor and regulate the operation of each of the adaptive voltage supplies that are contained on the integrated circuit.

While this discussed embodiment shows only a single voltage control circuit on the integrated circuit, it should be apparent that multiple voltage control circuits may be utilized to provide different voltages to different portions of the integrated circuit.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. In an integrated circuit having a substrate, an apparatus contained within the integrated circuit for providing a voltage scaling signal to adjust an internal voltage supplied to circuitry within the integrated circuit comprising:
a temperature measurement circuit having a thermal diode positioned upon the substrate for measuring temperature, the thermal diode connected to a voltage source and having a thermal diode output connected to a first input of a comparator, an address counter connected to a system clock, and providing an incrementing address to a first digital to analog converter connected to a second input of the comparator, the address counter further connected to a comparator output, and an address counter output wherein the thermal diode provides a voltage to the comparator which is compared to a voltage from the digital to analog converter and when equal, the comparator provides its output to the address counter which provides a resulting incremented address signal representing a measured temperature value;
an IR drop measurement circuit including:
a first loop oscillator circuit having a first plurality of invertors connected in a loop and each first loop invertor connected to an integrated circuit voltage source, the first loop oscillator circuit having a first loop frequency output;
a second loop oscillator circuit having a second plurality of invertors connected in a loop and each second loop invertor connected to a bandgap voltage source, the second loop oscillator circuit having a second loop frequency output;
a first difference circuit connected to receive the first and second loop frequency outputs and storing an IR drop value signal output to an IR drop register,
a frequency measurement circuit within the integrated circuit including a pulse width table connected to receive the resulting incremented address signal as an input address and providing a corresponding predetermined frequency output signal;
a second difference circuit connected to receive the predetermined frequency analog signal and the second loop frequency output and storing a frequency difference value output to a process sensor register;
a supervisor circuit connected to the IR drop register and the process sensor register and receiving user input values for either the IR drop register or the process sensor register and upon receiving the user input values, storing the received user input values to the IR drop register or the process sensor register in place of any previously stored values; and
a summing circuit connected to the IR drop register and the process sensor register and summing the values from the IR drop register and the process sensor register to provide the voltage scaling signal.

2. An electronic system contained upon an integrated circuit substrate comprising:
a thermal diode positioned upon the substrate and providing a temperature voltage representing a temperature of the substrate,
an address counting circuit connected to a system clock and providing an incrementally increasing address count value until a reset signal is received whereupon the address counting circuit provides a last address count value and initializes the address counting circuit to an initial address count value,
a digital temperature table connected to the address counting circuit and providing the initial address count value,
a first digital to analog converter connected to receive the incrementally increasing address count value and providing a corresponding address count voltage,
a comparator connected to receive the address count voltage from the first digital to analog converter and to receive the thermal diode temperature voltage and providing the reset signal to the address counting circuit when the temperature voltage and the address count voltage are equal,
a predicted frequency response table connected to receive the last address count value from the address counting circuit and the reset signal and providing a corresponding predicted frequency response value,
a first frequency circuit connected to a first reference voltage source providing a first frequency value,
a second frequency circuit connected to a second reference voltage source providing a second frequency value,
a first difference circuit connected to the predicted frequency response table and the first frequency circuit and providing a first difference value by subtracting the first frequency value from the predicted frequency response value,
a second difference circuit connected to the first frequency circuit and the second frequency circuit and providing a second difference value by subtracting the first frequency value from the second frequency value,
a summing circuit connected to the first and second difference circuits and summing the first and second difference values to provide the voltage scaling signal, and
a voltage regulator providing internal voltage to the electronic system wherein the internal voltage is of a magnitude that corresponds to a magnitude of the voltage scaling signal received from the summing circuit.

3. An electronic system according to claim 2 wherein said first frequency circuit includes a first ring oscillator circuit having an odd number of invertors connected in a series loop.

4. An electronic system according to claim 3 wherein the invertors of the first ring oscillator are each connected to a bandgap voltage source located upon the substrate.

5. An electronic system according to claim 3 wherein the second frequency circuit includes a second ring oscillator circuit having an odd number of invertors connected in a series loop wherein each of the invertors is connected to the internal voltage.

6. An electronic system according to claim 3 further including a first weight register circuit connected to a multiplier circuit which is connected to the first difference circuit output wherein data stored in the first weight register circuit is multiplied by the first difference circuit output in the multiplier circuit for providing a first weight input to increase or decrease the first difference value.

7. An electronic system according to claim 3 further including a second weight register circuit connected to a second multiplier circuit which is connected to the second difference circuit output wherein data stored in the second weight register circuit is multiplied by the second difference circuit output in the second multiplier circuit for providing a second weight input to increase or decrease the second difference value.

8. An electronic system according to claim 3 further including a third weight register circuit connected to a third multiplier circuit which is connected to the summing circuit output wherein data stored in the third weight register is multiplied by the summing circuit output for providing a third weight input to increase or decrease the voltage scaling signal.

9. An electronic system according to claim 3 further including a first weight register circuit connected to the first difference circuit providing a first weight input to increase or decrease the first difference value through a first multiplier circuit connected to the first difference circuit, a second weight register circuit connected to the second difference circuit providing a second weight input to increase or decrease the second difference value through a second multiplier circuit connected to the second difference circuit, and a third weight register circuit connect to the summing circuit providing a third weight input to increase or decrease the voltage scaling signal through a third multiplier circuit connected to the summing circuit, wherein the first, second and third weight register circuits are each connected to a supervisor circuit which stores user values therein.

\* \* \* \* \*